United States Patent [19]

Romeo

[11] 4,305,155
[45] Dec. 8, 1981

[54] EXTERIOR MOUNTED REMOTE CONTROL TELEVISION CHANNEL SELECTOR

[75] Inventor: Richard F. Romeo, Miller Place, N.Y.

[73] Assignee: Complete Control Co., Ltd., Oyster Bay Cove, N.Y.

[21] Appl. No.: 157,622

[22] Filed: Jun. 9, 1980

[51] Int. Cl.³ ............................................. H03J 9/00
[52] U.S. Cl. .................................. 455/153; 455/352; 358/194.1; 334/8; 74/10 A
[58] Field of Search ............. 455/151, 153, 162, 163, 455/170, 352, 353, 354; 334/8, 9, 20, 23; 358/194.1; 74/10 A; 340/694, 147 C

[56] References Cited

U.S. PATENT DOCUMENTS

| | | | |
|---|---|---|---|
| 2,642,757 | 6/1953 | Depweg | 455/151 |
| 2,815,444 | 12/1957 | Messner | 455/151 |
| 2,816,259 | 12/1957 | Papitto | 358/194.1 |
| 3,054,957 | 9/1962 | Shook | 455/151 |
| 3,116,454 | 12/1963 | Morris | 455/353 |
| 3,279,264 | 10/1966 | Huber et al. | 74/10.85 |
| 3,325,593 | 6/1967 | Platt | 455/151 |
| 3,892,920 | 7/1975 | Kolm | 179/1 VC |
| 3,962,748 | 6/1976 | Michaels | 455/153 |
| 3,984,779 | 10/1976 | Hughes | 455/153 |
| 3,988,680 | 10/1976 | Kolm | 358/194 |
| 4,081,840 | 3/1978 | Kolm | 358/194 |

Primary Examiner—Marc E. Bookbinder
Assistant Examiner—Tommy P. Chin
Attorney, Agent, or Firm—Blum, Kaplan, Friedman, Silberman & Beran

[57] ABSTRACT

An exterior mounted remote control television channel selector for use with a television receiver having a conventional manual channel selector knob is provided. A receiver mechanism is provided with a motor that is rotated in response to a remote control signal received thereby. A U-shaped linkage member is coupled to the motor and is rotated thereby. The U-shaped linkage member is adapted to be selectively coupled directly to the channel selector knob of a television receiver to thereby impart rotary motion of the channel selector knob and permit channel selection to be affected.

8 Claims, 4 Drawing Figures

EXTERIOR MOUNTED REMOTE CONTROL TELEVISION CHANNEL SELECTOR

BACKGROUND OF THE INVENTION

This invention is directed to an exterior mounted remote control television channel selector fully adaptable for use with television receivers having a rotatable channel selector knob, and in particular, to a remote control television channel selector mechanism that can be mounted to the exterior of a television receiver and releasably coupled to a channel selector knob to thereby convert a television receiver from manual tuning to fully automatic remote control tuning.

Remote control tuning of a television receiver is well known in the art. A remote control system is described in U.S. Pat. No. 3,029,005, and is particularly characterized by the incorporation of same in the television receiver at the time that same is manufactured. Although remote control tuning of a television is clearly preferred to manual tuning, because of the additional cost of remote control tuning, most televisions are purchased without this convenience item. Moreover, once purchased, a television that is limited to manual tuning cannot be practically converted to a remote control operation without substantially rebuilding the television to incorporate such a feature. Accordingly, a remote control television channel selector mechanism that can be utilized with most television receivers without modification to the television receiver is desired.

SUMMARY OF THE INVENTION

Generally speaking, in accordance with the instant invention, a remote control television channel selector mechanism for use with a manually operated channel selector mechanism of a television receiver, having a rotatable channel selector knob, is provided. In an exemplary embodiment, the exterior mounted channel selector mechanism of the instant invention includes a manually actuatable remote control coupled to a motor that is selectively rotated in response to the remote control being manually actuated. A U-shaped linkage member is coupled directly to the motor for imparting a rotary motion directly to the channel selector knob of a conventional television receiver. The motor and U-shaped linkage member are mounted to the exterior of the television receiver by a mounting member so that the U-shaped linkage member is releasably coupled directly to the channel selector knob whereby, upon the receipt of the remote signal, the motor is actuated thereby imparting a rotary motion through the U-shaped linkage member to the channel selector knob. Hence, the channel is selectively changed in response to the remote control signal being detected by the motor. The manually operated manual control can either be electrically coupled through a wire to the motor or a transmitter-receiver can be coupled to the motor to effect wireless remote control.

Accordingly, it is an object of the instant invention to provide an improved remote control television selector mechanism.

A further object of the instant invention is to provide a remote control television channel selector mechanism for converting a manually tunable television receiver into a television that can be automatically and remotely controlled.

Another object of the instant invention is to provide a remote control television selector mechanism for use with a manually operated television channel selector having a rotatable channel selector knob.

Still a further object of the instant invention is to provide a remote control television channel selector mechanism that is mounted to the exterior of a television receiver.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1A:
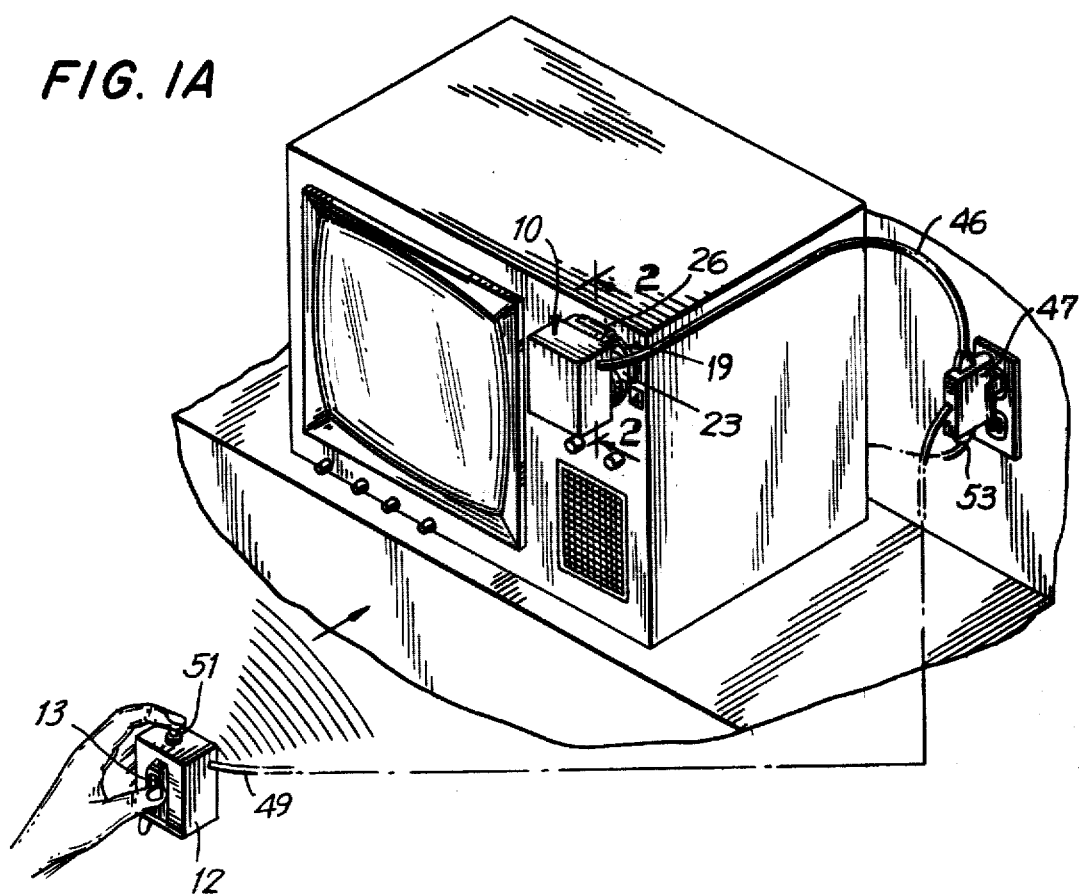
FIG. 1A is a perspective view of an exterior mounted remote control television channel selector mechanism constructed in accordance with a preferred embodiment of the instant invention.

Reference is first made to FIG. 1A wherein a remote control television channel selection mechanism, constructed in accordance with a preferred embodiment of the instant invention, is depicted. The remote control television channel selector mechanism includes a hand-held remote control, generally indicated as 12, having a least one manually operated switch 13, for selectively actuating the transmitter to thereby produce a remote control signal. As is explained in detail below, the manually operated switch 13 is adapted to remotely control the selection of the channel by the turning of a channel selector knob 18 of a television receiver by applying a remote control signal to the remote control mechanism located in a housing, generally indicated as 10.

Figure 2:
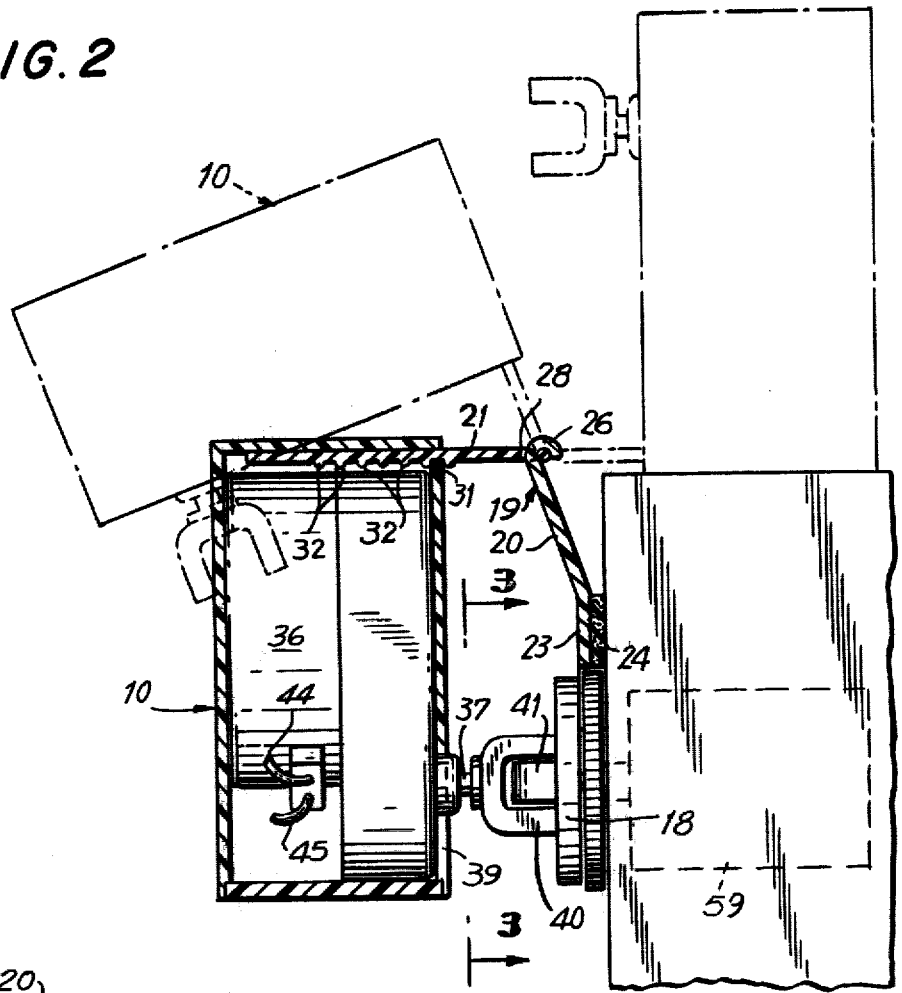
FIG. 2 is an enlarged sectional view taken along line 2—2 of FIG. 1A.
Figure 3:
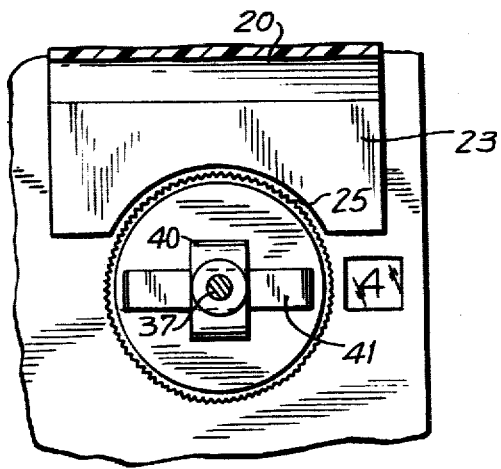
FIG. 3 is an enlarged sectional view taken along line 3—3 of FIG. 2.

Referring to FIGS. 1A and 2, it is noted that the housing 10 is hingedly secured to the television by a hinged coupling member, generally indicated as 19. Hinged coupling member 19 includes a first attaching element 20 and a supporting element 21, which elements are hingedly secured together to permit the housing 10 to be hingedly secured to the television receiver. Attaching element 20 includes a depending attachment flange 23, which flange has an adhesive pad 24 secured thereto. As is best illustrated in FIG. 3, the depending flange includes an arcuate cutout 25 to permit the attachment flange 23 to be disposed above, yet substantially adjacent, to the channel selector tuning knob of the television receiver. Adhesive pad 24 permits the releasable attachment and, hence, the coupling member 19 and flange 23 to be mounted to and positioned by the television receiver.

Figure 4:
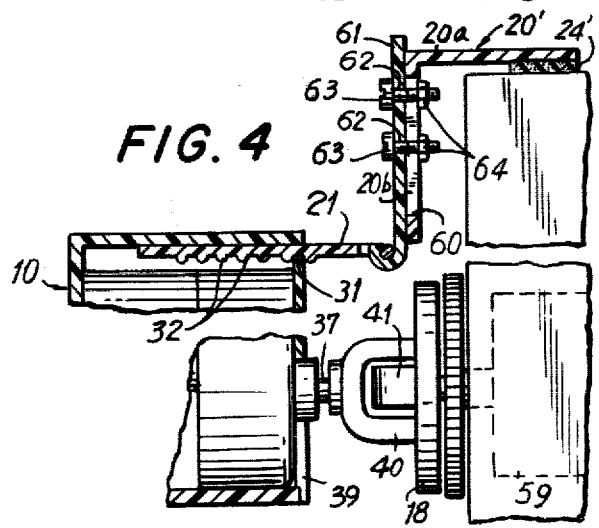
FIG. 4 is a sectional view depicting an alternative embodiment of the instant invention.

It is noted that the first attachment element can be secured to the television receiver at positions other than the positions illustrated in FIG. 1 and can be formed of two elements to permit vertical adjustment of the positions of the housing and attachment of the hinged coupling member to the top surface of the television. For example, as illustrated in FIG. 4, an attaching element 20' can be adhesively secured to the top surface of the television receiver adjacent the channel selector tuning knob, by an adhesive pad 24'. Attachment element 20' includes two substantially perpendicular arms 20a and 20b. Arm 20b is substantially parallel to the front surface of the television receiver and includes at least two elongated apertures 60 therein. A mounting element 61 includes apertures 62 therein for permitting screws 63 to extend therethrough and permit mounting element 61 to be releasably mounted to arm 20b of attaching element 20'. The elongated apertures are provided for allowing the position of housing 10 to be vertically adjusted to the proper location for the particular television receiver by loosening nuts 64 and, further permits vertical adjustment of the housing. Hence, an alternative mounting method and coupling member is provided which likewise allows housing 10 to be hingedly and releasably coupled to the top surface of the television receiver.

Referring again to FIG. 1, the other end of the attaching element 20 includes a circular loop 26 that is adapted to be inserted through an opening 28 formed in support element 21 to thereby normally position the attaching element so that same lies in an imaginary plane that is substantially perpendicular to the imaginary plane of the depending attaching flange 23 of the attachment element 20. Moreover, by inserting the loop 26 of the attaching element 20 into the opening 28 in the support element 21, the support element 21 is rotatable or pivotable in an upward direction to thereby permit the housing to be pivoted from the normally vertically oriented position, illustrated in FIG. 2, to the position illustrated in phantom in FIG. 2. The weight of the mechanism inside housing 10 causes the housing 10 to pivot toward the television receive and thereby aids in coupling the remote control channel selector mechanism to the manually controlled tuning knob in a manner described in detail below. Finally, support element 21 includes a plurality of ridges 32 that are adapted to be inserted into an opening 31 formed in the housing 10 to thereby releasably securably position the housing 10 on the support element 21 at a desired distance from the television receiver and permit same to be hingedly coupled to the television receiver by the hinged coupling member 19. The ridges 32 on the support element of the hinged coupling member 19 also allow the housing 10 to be frictionally removed from the opening in housing 10 so that the housing can be removed from the television receiver, thereby leaving only the hinged coupling member 19 secured to the television receiver thus allowing manual tuning of the television receiver. It is noted that if several hinged coupling members are provided, several televisions can be adapted to receive the housing 10, thereby converting a plurality of manually operated channel selector knobs to become remotely controlled in the manner discussed below.

Housing 10 supports an AC motor 36 therein. The AC motor 36 includes a drive shaft 37 that extends through an opening 39 in the sidewall of the housing 10. As illustrated in FIG. 2, motor 36 includes terminal leads 44 and 45, which leads are coupled through a twin lead wire 46 to a coupling jack 47 having a male electrical plug that is plugged into a conventional 120 AC wall outlet. Remote control 12 is coupled through a twin lead wire 49 to a coupler 47 and applies remote control signals therethrough to control the operation of the motor 36. Additionally, an ON-OFF switch 51 can be provided in the remote control 12 for selectively tuning on and off the television receiver by plugging the male plug 53 of the television receiver into the coupler 47, to thereby permit complete remote control of the television receiver.

Coupled to the motor 26 is a U-shaped linkage member 40. The U-shaped linkage member 40 is adapted to be coupled to the elongated rib 41 of the manual channel selector knob 18 of the television receiver. It is noted that most conventional television receivers that require manual tuning utilize a channel selector knob having an elongated rib, and the instant invention is particularly adapted to easily effect coupling to and rotation of said channel selector knob. Specifically, the hinged coupling member 19 is positioned on the television receiver so as to allow the U-shaped linkage member 40 to engage the elongated rib 41 of the channel selector knob 18, when the housing 10 is positioned by the hinged coupling member 19, in the manner indicated in FIGS. 2 and 3. As noted above, the weight of the motor 36 in the housing 10 causes the U-shaped linkage member to be firmly seated on elongated rib 41, and thereby further assure rotation of the channel selector knob thereby.

Accordingly, operation of an exemplary embodiment of the exterior mounted remote control television channel selector mechanism of the instant invention is as follows. In response to actuation of switch 13, the coupler 47 couples the motor 36 to a line current, and thereby effects rotation of shaft 37 of the rotor and, hence, a likewise rotation of the U-shaped linkage member 40. Because of the manner in which the U-shaped linkage member 40 is disposed in engagement with the elongated rib 41 of the channel selector knob 18, the channel selector knob 18 will be rotated to the desired channel, and thereby effect remote control channel tuning of the television received by the tuner 59 of the television receiver. In the alternative, the housing 10 can be manually lifted (FIG. 2) from the channel selector to thereby permit manual control of the channel selector knob 18.

It is noted that in the embodiment of FIG. 1A, by utilizing an ON-OFF switch 51, the coupler 47 can turn the television receiver on or off by selectively cutting off the line current to the television receiver when the male plug 53 is coupled thereto. Thus, an inexpensive remote control mechanism is provided that can effectively turn a television receiver on and off and, further, effect remote selection of the channels by being exteriorly mounted to the television receiver.

Figure 1B:
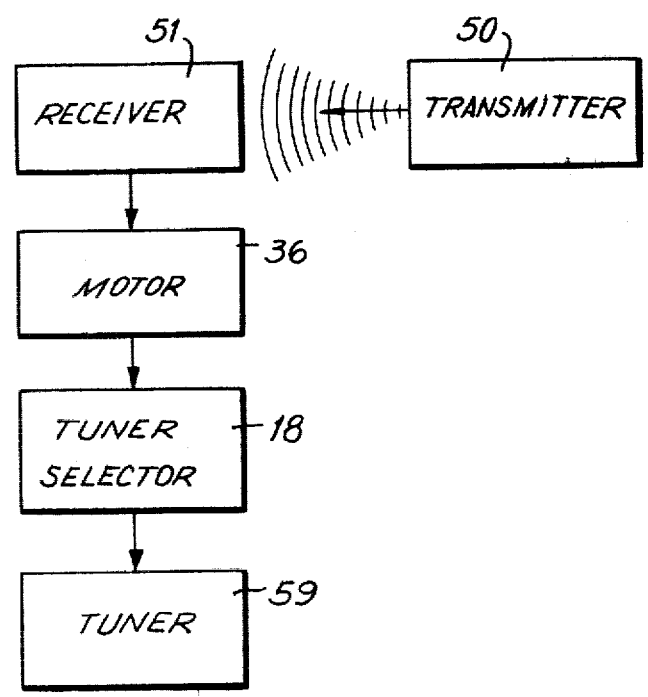
FIG. 1B is a block circuit diagram of a further embodiment of the remote control television channel selector mechanism illustrated in FIG. 1A.

Reference is now made to FIG. 1B, wherein a second embodiment of the instant invention is depicted. Specifically, instead of using a twin lead wire to couple the remote control 12 to the motor 36, a transmitter 50 and receiver 51 can be utilized to effect a wireless remote control of the motor 36. The manner in which the remote control signal, produced by the transmitter 50, is applied to the receiver 51 is described in detail in U.S. Pat. No. 3,029,305, which patent is incorporated by reference as if fully set forth herein. Motor 36 would then be coupled to receiver 51 and would rotate tuner selector knob 18 to thereby control the television channel selector mechanism 19 of the television receiver tuner 59 and provide a wireless remote control mechanism that can readily be adapted to most television receivers.

The instant invention is particularly characterized by an exterior mounted channel selector mechanism assembly that can be releasably coupled directly to the channel selector knob of most television receivers to thereby permit same to be tuned by remote control. Moreover, by providing a housing and coupling member releasably securable thereto, coupling members can be provided for different television receivers and a single housing can be used interchangeably with each of the television receivers having a coupling member secured thereto. Finally, as aforenoted, the coupling member need not be adhesively secured to the front surface of the television receiver and, instead, as aforenoted can be provided with a configuration to permit same to be mounted to the top surface of the television receiver.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language might be said to fall therebetween.

What is claimed is:

1. A channel selector mechanism for television receivers each of which includes a channel selector knob having an elongated rib of various width for selecting a predetermined channel corresponding to the rotary position of said knob, comprising manually actuatable control means for selectively generating a remote control signal, receiving means positioned remotely from said control means for receiving said remote control signal generated by said control means and for being actuated in response thereto, a coupling member for mechanically releasably securing said receiving means to said television receiver, said receiving means including a motor for imparting a rotary drive in response to the actuation of said receiving means, said receiving means including a housing for supporting said motor, said housing being adapted to be mechanically releasably secured to said coupling member, operative means for releasably coupling said motor means to the elongated rib of said channel selector knob and for imparting a rotary drive to the channel selector knob in response to said remote control signal being received by said receiving means, said operative means including a linkage member having at least two spaced apart upright members that define a U-shaped profile and that are mechanically coupled to the motor, said upright members being spaced apart by a distance sufficient to permit said channel selector knobs having an elongated rib of various widths to be positioned therebetween so that said linkage member is releasably engageable with said elongated rib to affect rotation thereof, said coupling member including a supporting element that is adapted to releasably support said housing, and an attachment element joined to said supporting element and adapted to be adhesively secured to said television receiver, said supporting element being normally positioned with respect to said attachment element so that said linkage member is positioned in releasable engagement with the elongated rib of the channel selector knob.

2. A channel selector mechanism as claimed in claim 1, wherein said coupling member includes pivot means for permitting said housing to be pivoted away from said channel knob, and thereby permit manual rotation of said selector knob.

3. A channel selector mechanism as claimed in claim 1, wherein said attachment element includes a depending flange that is adapted to be adhesively disposed in flush engagement with said television receiver, said depending flange including an arcuate cut-out for permitting said coupling member to be disposed adjacent to said channel selector knob of said television receiver.

4. A channel selector mechanism, as claimed in claim 1, wherein said attachment element includes two walls, one of said walls adapted to be adhesively secured to the top surface of said television receiver, and a mounting member intermediate said supporting element and other one of said walls for mounting the supporting element to said attachment element.

5. A channel selector mechanism, as claimed in claim 4, wherein said other one of said walls includes a plurality of elongated apertures therein, and said mounting member includes a plurality of apertures adapted to be aligned with said elongated apertures for allowing positioning adjustment of said housing to be effected thereby.

6. A channel selector mechanism, as claimed in claims 1, 3 or 5, wherein said supporting element and said attachment element each define pivot means for cooperating with each other to permit said supporting member to be pivoted from said normal position and thereby remove said U-shaped coupling member for engagement with said elongated rib.

7. A channel selector mechanism, as claimed in claim 1, wherein said receiving means includes a coupler, said coupler being selectively coupled through a wire means to said motor, said coupler being further coupled to manually actuatable control means through a wire means, said coupler being adapted in response to the actuation of said control means to effect engagement of said motor and cause said U-shaped linkage member to rotate.

8. A channel selector mechanism, as claimed in claim 1, wherein said receiving means is a receiver disposed in said housing, and said control means includes a transmitter, said transmitter being adapted to transmit to said receiver control signals for actuating said motor to effect selective rotation of said channel selector knob.

* * * * *